(12) United States Patent
Yamada et al.

(10) Patent No.: US 7,785,984 B2
(45) Date of Patent: Aug. 31, 2010

(54) MANUFACTURING METHOD FOR SEMICONDUCTOR DEVICE

(75) Inventors: Nobuhide Yamada, Tokyo (JP); Rempei Nakata, Kamakura (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 577 days.

(21) Appl. No.: 11/812,478

(22) Filed: Jun. 19, 2007

(65) Prior Publication Data
US 2008/0003775 A1 Jan. 3, 2008

(30) Foreign Application Priority Data
Jun. 19, 2006 (JP) ............................. 2006-168928

(51) Int. Cl.
*H01L 21/76* (2006.01)
(52) U.S. Cl. ...................................... 438/435
(58) Field of Classification Search ................. 438/435
See application file for complete search history.

(56) References Cited

U.S. PATENT DOCUMENTS

| 6,245,641 | B1 | 6/2001 | Shiozawa et al. |
| 6,300,219 | B1 | 10/2001 | Doan et al. |
| 6,429,147 | B2 * | 8/2002 | Hara ........................... 438/763 |
| 7,052,971 | B2 | 5/2006 | Nishiyama et al. |
| 2004/0248375 | A1 | 12/2004 | McNeil et al. |
| 2006/0046425 | A1 * | 3/2006 | Sandhu ........................ 438/424 |
| 2007/0004139 | A1 * | 1/2007 | Kim et al. .................... 438/257 |

OTHER PUBLICATIONS

Chung et al.; "Novel Shallow Trench Isolation Process Using Flowable Oxide CVD for Sub-100nm DRAM"; 9.4.1-9.4.4,IEDM, pp. 233-236, (2002).
U.S. Appl. No. 11/819,275, filed Jun. 26, 2007, to Yamada.

* cited by examiner

*Primary Examiner*—Bradley K Smith
(74) *Attorney, Agent, or Firm*—Finnegan, Henderson, Farabow, Garrett & Dunner, L.L.P.

(57) ABSTRACT

A manufacturing method for a semiconductor device includes generating on a substrate liquid-phase silanol having fluidity by causing a source gas made of a material containing silicon to react with a source gas made of a material containing oxygen, introducing the silanol into a first recess having an aspect ratio of a predetermined value wholly, and introducing the silanol into a space from a bottom to an intermediate portion in a second recess having an aspect ratio lower than the predetermined value, the first and second recesses are provided in the substrate, burying a silicon oxide film in the first recess and providing the silicon oxide film in the second recess by converting the silanol into the silicon oxide film by dehydrating condensation, and providing a dielectric film having film density higher than that of the silicon oxide film on the silicon oxide film.

18 Claims, 9 Drawing Sheets

MANUFACTURING METHOD FOR SEMICONDUCTOR DEVICE

CROSS-REFERENCE TO RELATED APPLICATIONS

This application is based upon and claims the benefit of priority from prior Japanese Patent Application No. 2006-168928, filed Jun. 19, 2006, the entire contents of which are incorporated herein by reference.

BACKGROUND OF THE INVENTION

1. Field of the Invention

The present invention relates to a manufacturing method for a semiconductor device for burying a recess, particularly to a manufacturing method for a semiconductor device capable of easily and efficiently burying plural recesses having different aspect ratios.

2. Description of the Related Art

Recently, in a process of forming a dielectric film in a recess portion such as an shallow isolation trench among processes of manufacturing the semiconductor device, as a finer-line process and a higher-level of integration develop in an element and an interconnect, use of high-density plasma VD (HDP-CVD) method being common. However, with further development of the finer-line process and higher-level of integration, even if the HDP-CVD method is used, there is easily generated a problem that a frontage (opening) is closed to generate a void inside the trench before the inside of the trench is filled with the dielectric film. That is, even with the HDP-CVD method, a property of filling the fine trench is approaching a limit. Therefore, there is demanded a dielectric film forming technique having the excellent trench filling property which can deal with the trench having the higher aspect ratio (trench depth/opening width).

A coating film can be cited as an example of the film having the excellent trench filling property. However, in the coating film, cracking and peeling off easily occur, and a device property is possibly degraded by a fixed charge. In order to prevent the problems that may arise, a space pattern having a wider area in a line and space pattern, where the volume of the coating film is increased, is removed by etching. However, in order to perform the etching, it is necessary that a lithography process be newly added to cover the narrow pitch region such as the memory cell portion with a resist film or another dielectric film, which possibly results in cost increase.

There is a so-called condensation CVD method as the film forming method having the excellent trench filling property. For example, a technique of using the condensation CVD is disclosed in "Novel shallow trench isolation process using flowable oxide CVD for sub-100-nm DRAM", Sung-Woong, et al., 9.4.1-9.4.4, IEDM 233-236, 2002 IEEE. However, there is a problem that the film formed by the condensation CVD method is inferior to the film formed by the HDP-CVD method in a crack-resistant property. For example, the dielectric film is deposited by the condensation CVD method until a thickness required in a device design stage is obtained. Or, the dielectric film is deposited by the condensation CVD method until the thickness required in a manufacturing process allowing a margin in polishing of post-forming is obtained. Then, there is a risk of cracking in the dielectric film. Particularly, the risk of cracking in the dielectric film is increased when the dielectric film formed by the condensation CVD method is exposed to a high temperature in the process of manufacturing a transistor periphery.

BRIEF SUMMARY OF THE INVENTION

According to an aspect of the invention, there is provided a manufacturing method for a semiconductor device comprising: generating on a substrate liquid-phase silanol having fluidity by causing source gas made of a material containing silicon to react with a source gas made of a material containing oxygen, introducing the silanol into a first recess until the first recess is filled with the silanol, the first recess having an aspect ratio of a predetermined value or more in a plurality of recesses provided in the substrate and having different aspect ratios, and introducing the silanol into a space from a bottom to an intermediate portion in a second recess while an inner side-face portion is covered with the silanol, the second recess having an aspect ratio lower than the predetermined value in the recesses; burying a silicon oxide film in the whole of the first recess and providing the silicon oxide film from the bottom to the intermediate portion in the second recess while the inner side-face portion thereof is covered with the silicon oxide film, by converting the silanol introduced into the first and second recesses into the silicone oxide film by dehydrating condensation; and providing a dielectric film on the silicon oxide film until the dielectric film is buried from the intermediate portion to an upper portion in the second recess in which the silicon oxide film is provided, the dielectric film having film density higher than that of the silicon oxide film.

DETAILED DESCRIPTION OF THE INVENTION

An embodiment of the invention will be described below with reference to FIGS. 1A to 9D. A technique of burying plural recesses (trenches), made in a superficial portion of a semiconductor substrate and having different aspect ratios, with a dielectric film will be described in the embodiment. Specifically, in the plural recesses made in the superficial portion of the semiconductor substrate included in a flash memory, an inside of the shallow isolation trench (STI) made in a memory cell forming region with a narrow pitch is buried to an upper portion with the dielectric film which is formed by a film forming method called condensation CVD method (described in detail later). On the other hand, the inside of the widely-made trench in a forming region of peripheral circuits except for a memory cell is not fully buried to the upper portion with the dielectric film, but the dielectric film is provided in a lower portion of the inside of the widely-made trench by the condensation CVD method. In the wide trench, the remaining upper portion where the dielectric film is not provided is buried with the dielectric film using the plasma enhanced CVD (PE-CVD) method such as the high-density plasma CVD (HDP-CVD) method.

The whole of the trench, made in the memory cell forming region and having a high aspect ratio, is buried with a one-layer dielectric film. On the other hand, the trench, made in the peripheral circuit forming region and having a low aspect ratio, is buried with a two-layer stacked dielectric film including at least two kinds of dielectric film. The detailed description will be given below.

Figure 1A:
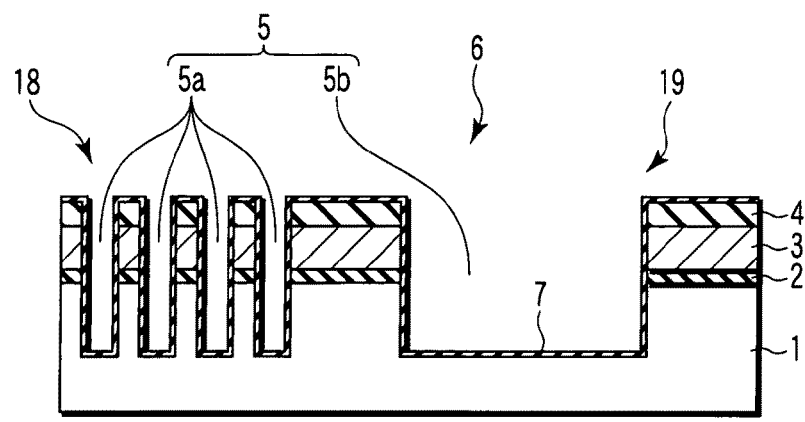
FIGS. 1A, 1B, and 1C are process sectional views showing a manufacturing method for a semiconductor device according to an embodiment of the invention.

As shown in FIG. 1A, a tunnel oxide film 2, a polysilicon (Poly-Si) film 3, a SiN film 4 are sequentially stacked on a surface of a semiconductor substrate (silicon wafer) 1. The tunnel oxide film 2 constitutes a tunnel gate dielectric film. The polysilicon (Poly-Si) film 3 constitutes a floating gate electrode. The SiN film 4 constitutes a mask film or a stopper film when the semiconductor substrate 1, tunnel oxide film 2, and polysilicon film 3 are processed.

Then, as shown in FIG. 1A, plural recess 5 having different aspect ratios are made from the SiN film 4 to a superficial portion of the semiconductor substrate 1 by usual lithography and etching. Specifically, plural first recesses 5a having the width of about 100 nm or less and the aspect ratio (depth/width) of at least 3 are made at substantially constant narrow intervals. At the same time, at least one second recess 5b having substantially the same depth as the first recesses 5a and the width wider than those of the first recesses 5a is made while separated away from the closest first recess 5a by a distance greater than the interval between the first recesses 5a. That is, at least one second recess 5b having the aspect ratio lower than 3 is made in the region adjacent to the forming region of the first recesses 5a. In this manner, a so-called line and space (L/S) pattern 6 is formed on the semiconductor substrate 1.

The first recesses 5a are made in a forming region 18 of a later-mentioned memory cell unit 17 to constitute the shallow isolation trench having a shallow trench isolation (STI) structure. Each shallow isolation trench (first recess) 5a is usually made with the minimum pitch within a range of a design rule. On the other hand, the second recess 5b is made in a forming region 19 of the peripheral circuit such as a high-voltage transistor (not shown), which is the region other than the memory cell forming region 18, and the second recess 5b constitutes the trench for isolating the peripheral circuit from the memory cell unit 17 or the isolation trench in the peripheral circuit forming region 19. The trench (second recess) 5b is usually made with the pitch greater than that of each shallow isolation trench 5a within the permissible range of the design rule.

Then, as shown in FIG. 1A, a liner film 7 is provided in the first and second recesses 5a and 5b by a thermal CVD method so as to cover the surfaces of the semiconductor substrate 1, tunnel oxide film 2, polysilicon film 3, and SiN film 4. The liner film 7 is provided to protect the tunnel oxide film 2 and to ensure insulating property between the adjacent memory cells. In the embodiment, a thin silicon oxide film is formed as the liner film 7.

Figure 1B:
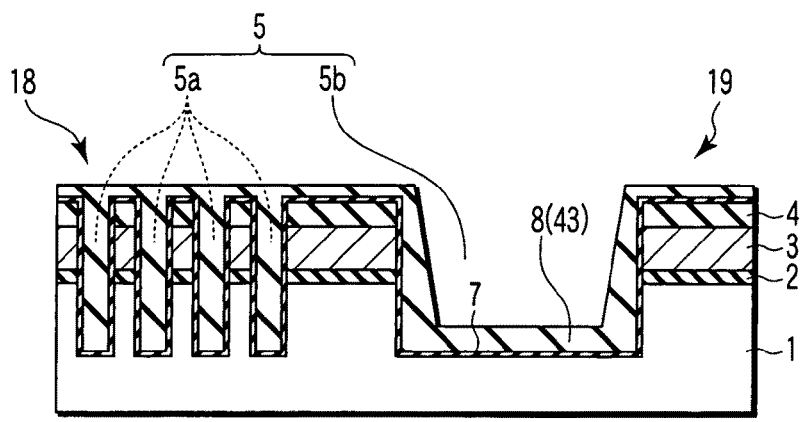

As shown in FIG. 1B, a silicon oxide film 8 is provided as a first buried dielectric film in the first and second recesses 5a and 5b while the surface of the liner film 7 is covered with the silicon oxide film 8. The silicon oxide film 8 is formed by a film forming method called condensation CVD method. The condensation CVD method has a characteristic that a film forming rate (deposition speed or burying speed) is increased in a narrow space like the memory cell forming region 18 (shallow isolation trench 5a) while the film forming rate is decreased in a wide space like the peripheral circuit forming region 19. The condensation CVD method will specifically be described in detail with reference to FIGS. 4 to 6.

Figure 4:
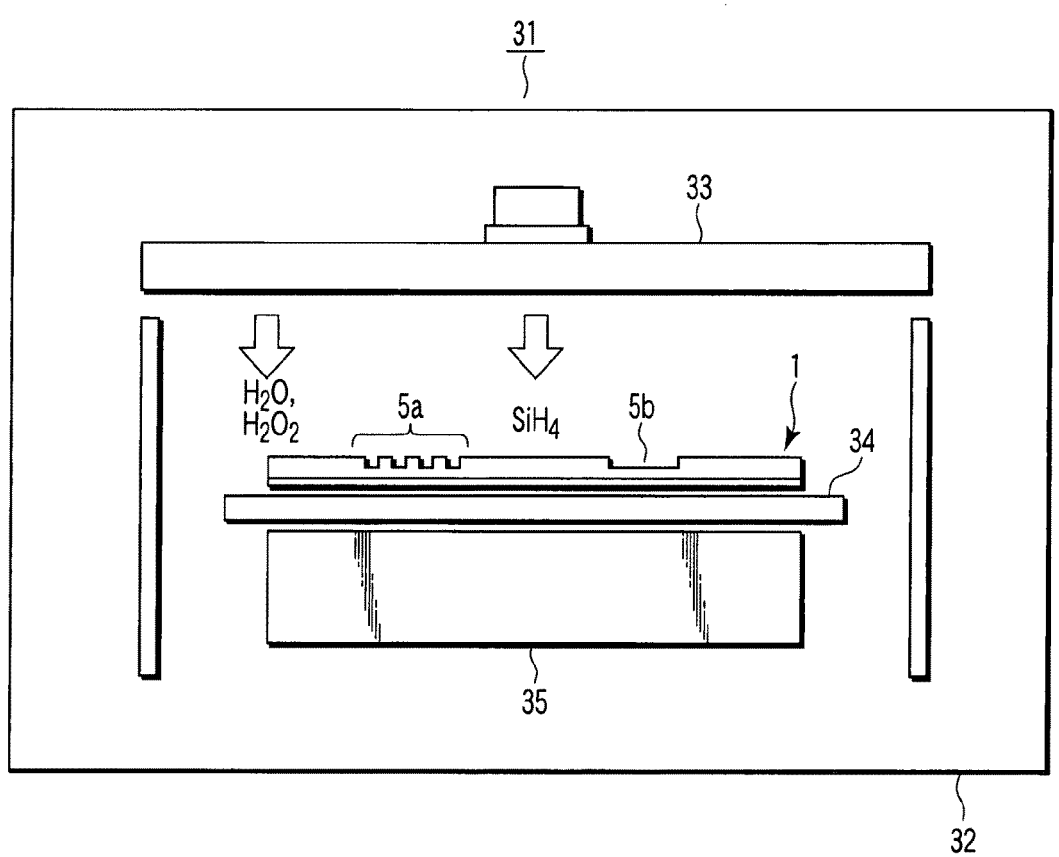
FIG. 4 schematically shows a film forming apparatus of the embodiment.

As shown in FIG. 4, the semiconductor substrate 1 in which the liner film 7 is provided is accommodated in a substrate cooling chamber 32 included in a film forming apparatus 31. At this time, the semiconductor substrate 1 is placed on a substrate cooling wafer stage 34 such that a primary plane on which the first and second recesses 5a and 5b are made faces a showerhead (nozzle) 33 for supplying a source gas of the silicon oxide film 8 into the chamber 32. A substrate cooling device 35 for cooling the semiconductor substrate 1 through the wafer stage 34 is provided on the side of the wafer stage 34 opposite to the side on which the semiconductor substrate 1 is placed. The semiconductor substrate 1 placed on the wafer stage 34 is set at a temperature ranging from about −10 to 15° C. by the substrate cooling device 35.

Then, the source gas of the silicon oxide film 8 is supplied from the showerhead 33 toward the surface of the semiconductor substrate 1 cooled to a predetermined temperature. A source gas which, upon adhering to the surface of the semiconductor substrate 1, starts reaction to become a material having fluidity is preferably used. The material having fluidity is obtained in the case where an intermediate product is left at a temperature of a boiling point or less in the middle of the reaction or in the case where an equilibrium condition between a liquid phase and a gas phase is achieved. The source gas may be activated with plasma. In the embodiment, the source gas made of silane ($SiH_4$) which is a material (compound) containing silicon (Si) and the source gas made of water ($H_2O$) and hydrogen peroxide ($H_2O_2$) which are materials (compounds) containing oxygen (O) are supplied toward the surface of the semiconductor substrate 1.

Figure 5:
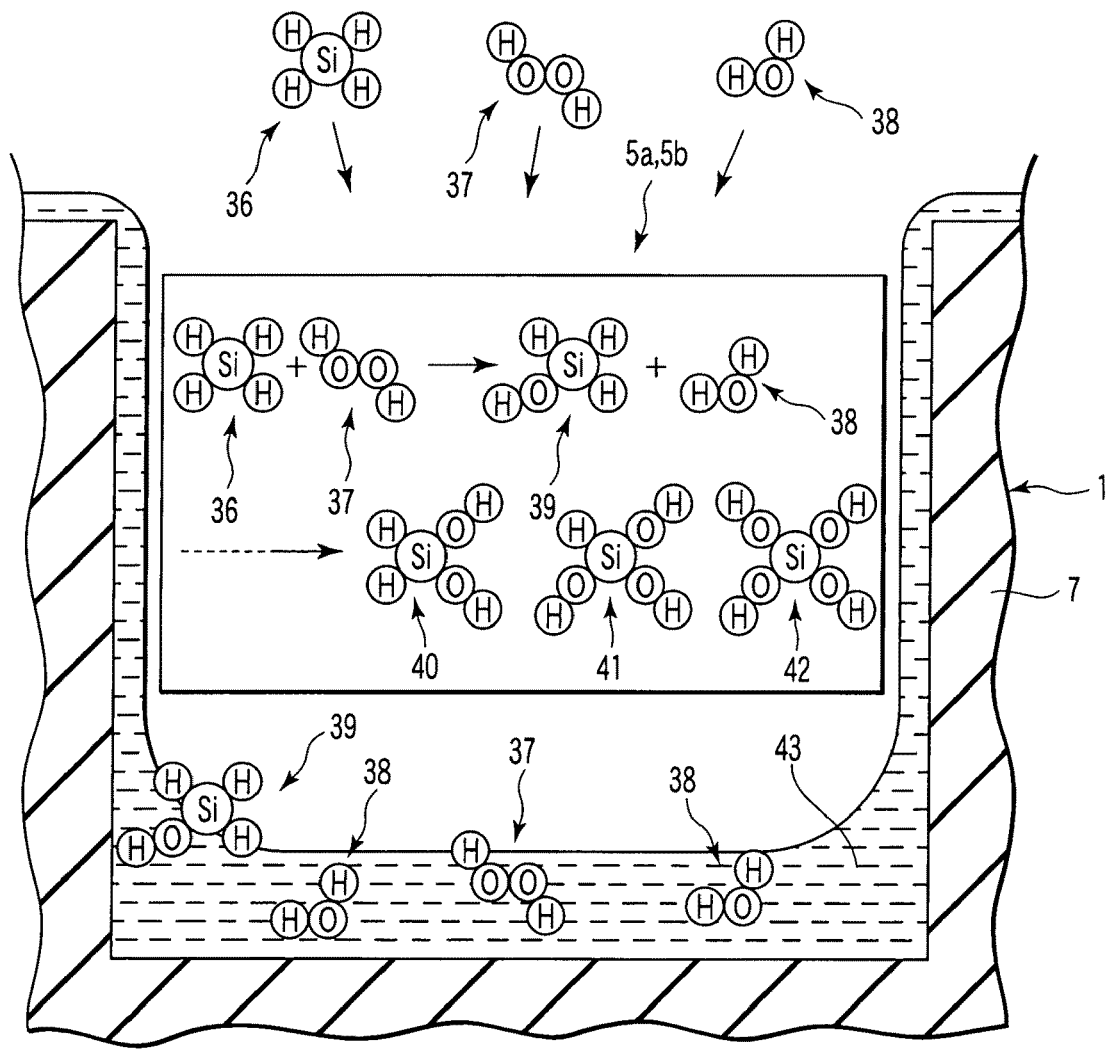
FIG. 5 schematically shows a film forming method of the embodiment.

As shown by a frame of a solid line in FIG. 5, when the source gases adhere to the surface of the semiconductor substrate 1, among a silane molecule ($SiH_4$) 36, a hydrogen peroxide molecule ($H_2O_2$) 37, and a water molecule ($H_2O$) 38 which are contained in the source gases, a surface reaction is generated between the silane molecule ($SiH_4$) 36 and the hydrogen peroxide molecule ($H_2O_2$) 37 on the surface of the semiconductor substrate 1. For example, it is conceivable that at least one hydrogen (H) contained in the silane molecule ($SiH_4$) 36 is exchanged for the hydroxyl group (OH) contained in the hydrogen peroxide molecule ($H_2O_2$) 37. Or, it may be occurred that the oxygen (O) contained in the hydrogen peroxide molecule ($H_2O_2$) 37 is taken by the silane molecule ($SiH_4$) 36 to generate a $SiH_4O$ molecule 39 and the water molecule ($H_2O$) 38 as a reaction intermediate product. Then, the similar reactions are repeatedly performed to generate liquid-phase silanol 43 having the fluidity on the surface of the semiconductor substrate 1 and in gas phase in addition to the $SiH_4O$ molecule 39. The silanol 43 which is the reaction intermediate product contains a $SiH_4O_2$ molecule 40, a $SiH_4O_3$ molecule 41, and a $SiH_4O_4$ molecule 42. As shown in FIG. 5, at this point, the hydrogen peroxide molecule ($H_2O_2$) 37 and the water molecule ($H_2O$) 38 are still contained in the liquid-phase silanol 43.

As shown in FIGS. 1B and 5, while the surface of the liner film 7 is covered with the liquid-phase silanol 43, the liquid-phase silanol 43 flows into the first and second recesses 5a and 5b. As shown in FIG. 1B, the silanol 43 is generated until each first recess 5a is filled by the silanol 43 and the silanol 43 reaches the opening portion of each first recess 5a. At this point, different from the ordinary selective CVD method, the silanol 43 spreads over the flat portion like as the surface of the liner film 7 on the SiN film 4 and so on equally, and the silanol 43 introduced into each first recess 5a spreads over the inside portion like as the inner side-surface and bottom-surface of each first recess 5a equally due to the fluidity of the silanol 43. Obviously, in the first recess 5a, the silanol 43 reaches the position above the tunnel oxide film 2. Accordingly, the first recess (STI) 5a having the higher aspect ratio is closely filled with the liner film 7 and the silanol 43.

On the other hand, the silanol 43 introduced into the second recess 5b flows along the surface of the liner film 7 due to the fluidity while an inner side-face portion of the second recess 5b is covered with the silanol 43. As shown in FIG. 1B, in the second recess 5b, the silanol 43 reaches only an intermediate portion from the bottom. Specifically, in the second recess 5b, the silanol 43 reaches the position below the tunnel oxide film 2 except for the inner side-face portion. That is, the whole of the second recess 5b having the lower aspect ratio is not closely filled with the liner film 7 and the liquid-phase silanol 43, and a space from the intermediate portion to the upper portion is left empty except for the inner side-face portion.

As described above, the first recesses 5a as narrow trenches are more quickly filled up by the liquid-phase silanol 43 than the second recess 5b as a wide trench. And, for example, two main reasons which will be described below are conceived as the reason of narrow trenches 5a are quickly buried by the liquid-phase silanol 43. As the first reason of it is the inflow of the liquid-phase silanol 43 into the first recesses 5a, as described above. And as the second reason of it is the possibility of arising of the difference of surface energy between inside of the first recesses 5a and the flat portion like as the surface of the liner film 7 on the SiN film 4. More specifically, it conceived that a phenomenon like as the capillary action occurs while the liquid-phase silanol 43 flowing into the first and second recesses 5a and 5b, and the surface of the liquid-phase silanol 43 is bended by the surface tension in the vicinity of the opening portion of the first recesses 5a. This enables to cause the difference of surface energy between inside of the first recesses 5a and the flat portion. As a result of this, the liquid-phase silanol 43 may deposit faster or may easily flows into the first recesses 5a as narrow trenches than into the second recess 5b as a wide trench.

As described above, a burying material is not always deposited from the bottom towards the opening portion of the recess in the condensation CVD method, different from the selective CVD method. In the condensation CVD method, the condensation occurs on the all surfaces regardless of trench or flat portion.

Then, the semiconductor substrate 1, in which each first recess 5a is closely filled with the silanol 43, is taken out from the substrate cooling chamber 32, and is accommodated in a substrate heating second chamber (not shown) included in the film forming apparatus 31. The semiconductor substrate 1 is placed on a substrate heating wafer stage provided in the substrate heating second chamber, and heat treatment is performed to the semiconductor substrate 1.

Figure 6:
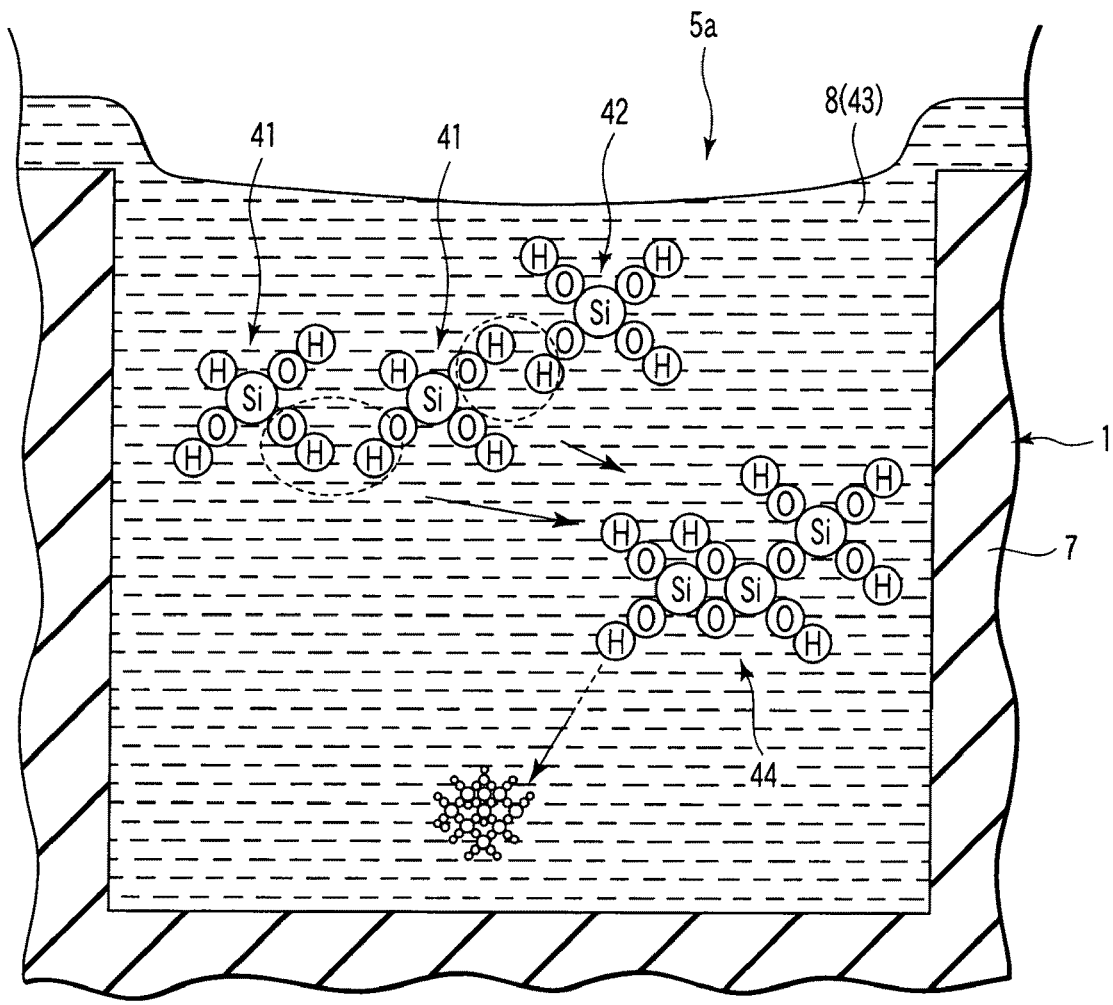
FIG. 6 schematically shows a film forming method of the embodiment.

As shown by a frame of a broken line in FIG. 6, when the silanol 43 is heated, a dehydrating reaction occurs between the two $SiH_4O_3$ molecules 41 and between the $SiH_4O_3$ molecule 41 and the $SiH_4O_4$ molecule 42 which are reaction intermediate products contained in the silanol 43, and one water molecule ($H_2O$) 38 is desorbed from each molecule 41 or 42. Thus, as shown by a solid-line arrow in FIG. 6, one $Si_xH_yO_z$ molecule (x, y, and z are integers of at least 2) 44 is generated from the plural molecules of the reaction intermediate products. Then, as shown by a broken-line arrow in FIG. 6, the dehydrating reaction occurs among the plural $Si_xH_yO_z$ molecules 44 to perform condensation polymerization in the $Si_xH_yO_z$ molecules 44 by continuously heating the silanol 43.

However, all kind of molecules 36, 37, 38, 39, 40, 41, 42, 43, 44 participate in the dehydrating condensation reaction described above with referring to FIGS. 5 and 6 are only one instance. For example, the dehydrating condensation reaction in the silanol 43 is not necessarily to start after the silane ($SiH_4$) 36 is exchanged for the $SiH_4O_4$ molecule 42 at all. And the bonding ratio of the Si—H, or the conversion ratio of the Si—OH from the Si—H, which stays behind in the silanol 43 is not necessarily to limit the value as described above.

Thus, the dehydrating condensation reaction is generated in a chain-reaction manner in the silanol 43 by performing the heat treatment to the liquid-phase silanol 43, and thereby the water molecule ($H_2O$) 38 and the hydrogen peroxide molecule ($H_2O_2$) 37 are extracted from the silanol 43. This enables the liquid-phase silanol 43 to be converted into the solid-phase silicon oxide film 8 mainly made of silicon dioxide ($SiO_2$) as shown in FIG. 6. As a result, as shown in FIG. 1B, the silicon oxide film 8 is formed on the semiconductor substrate 1 while the surface of the liner film 7 is covered with the silicon oxide film 8. Then, the semiconductor substrate 1 in which the silicon oxide film 8 is formed is taken out from the substrate heating chamber, and the condensation CVD method according to the embodiment is ended.

In each first recess 5a which is formed as the narrower pattern in the memory cell forming region 18, the silicon oxide film 8 which is the condensation CVD film is formed while reaching the position above the tunnel oxide film 2 through the above processes due to the characteristics of the condensation CVD method. That is, each entire first recess (STI) 5a having the higher aspect ratio is closely filled, from the bottom to top thereof, with the liner film 7 and the silicon oxide film 8. On the other hand, in the second recess 5b which is formed as the broader pattern in the peripheral circuit forming region 19 adjacent to the memory cell forming region 18, the silicon oxide film 8 is formed only up to the position below the tunnel oxide film 2 except for the inner side-face portion of the second recess 5b due to the characteristics of the condensation CVD method. That is, in the second recess 5b having the lower aspect ratio, only the space from the bottom to the intermediate portion is covered with the liner film 7 and the silicon oxide film 8, and the space from the intermediate portion to the upper portion is left empty except for the inner side-face portion.

In the film forming process of the silicon oxide film 8 by the condensation CVD method of the embodiment, the film forming process of the silicon oxide film 8 is stopped at a stage in which each first recess 5a is fully filled with the silicon oxide film 8. Each first recess 5a having the aspect ratio of at least 3 is formed at the minimum pitch in the memory cell forming region 18. The second recess 5b having the aspect ratio lower than 3 is formed at a pitch greater than that of the first recess 5a in the peripheral circuit forming region 19 adjacent to the memory cell forming region 18. In the second recess 5b, the thin silicon oxide film 8 is left while the inner side-face portion and the space from the bottom to the intermediate portion are covered with the silicon oxide film 8.

Figure 1C:
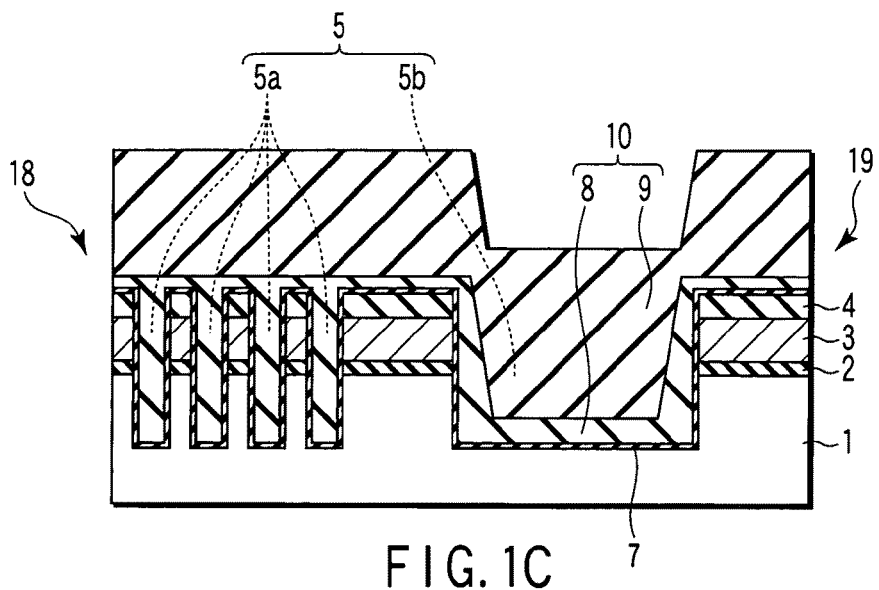

As shown in FIG. 1C, a second buried dielectric film 9 is provided while the surface of the silicon oxide film 8 which is the first buried dielectric film is covered therewith. In the embodiment, as with the first buried dielectric film 8, it is assumed that the silicon oxide film is used as the second buried dielectric film 9. However, the dielectric film having the film density higher than that of the first buried dielectric film 8 is formed as the second buried dielectric film 9. Therefore, unlike the silicon oxide film 8 which is the first buried dielectric film, the silicon oxide film 9 which is the second buried dielectric film is formed by a film forming method in which the denser film can be formed compared with the condensation CVD method. Specifically, the silicon oxide film 9 is formed by the high-density plasma CVD (HDP-CVD) method which is a kind of the plasma enhanced (PE-CVD) method. The space from the intermediate portion to the upper portion, which is the cavity of the second recess 5b and is not filled only with the liner film 7 and the silicon oxide film 8, is closely filled with the silicon oxide film 9. The silicon oxide film 9 is formed with stacking on the silicon oxide film 8 until reaching the position above the SiN film 4.

The second recess 5b having the lower aspect ratio, which is formed in the peripheral circuit forming region 19, is closely filled with the liner film 7, the silicon oxide film 8 formed by the condensation CVD method, and the silicon oxide film 9 which is formed to be denser and thicker than the silicon oxide film 8 by the high-density plasma CVD method. That is, the second recess 5b is closely filled with the liner film 7 and a buried stacked dielectric film 10. The buried stacked dielectric film 10 is formed by a two-layer structure including the lower-layer silicon oxide film 8 which is a lower-layer buried dielectric film and the upper-layer silicon oxide film 9 which is an upper-layer buried dielectric film.

Figure 2A:
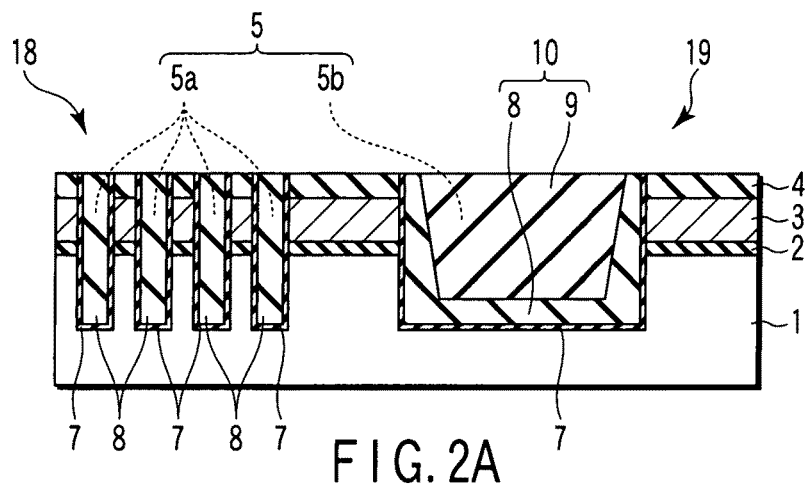
FIGS. 2A, 2B and 2C are process sectional views showing a manufacturing method for a semiconductor device of the embodiment.

As shown in FIG. 2A, the unnecessary liner film 7, lower-layer silicon oxide film 8, and upper-layer silicon oxide film 9 are removed from the semiconductor substrate 1 in which the buried stacked dielectric film 10 is provided. Specifically, planarization is achieved in such a manner that a CMP method is performed to the liner film 7, lower-layer silicon oxide film 8, and upper-layer silicon oxide film 9 which are located at positions above the SiN film 4 until the surface (upper surface) of the SiN film 4 is exposed. Therefore, the unnecessary liner film 7, lower-layer silicon oxide film 8, and upper-layer silicon oxide film 9 which are located at positions above the SiN film 4 are polished and removed.

This enables each first recess (STI) 5a to be closely filled with the liner film 7 and the silicon oxide film 8 which is the condensation CVD film. That is, each first recess (STI) 5a is closely filled with the liner film 7 and the single-layer silicon oxide film 8 made of the single film material. On the other hand, the second recess 5b is closely filled with the liner film 7, the lower-layer silicon oxide film 8 which is the condensation CVD film, and the upper-layer silicon oxide film 9 which is the HDP-CVD film. That is, the second recess 5b is closely filled with the liner film 7 and the buried stacked dielectric film 10 having the two-layer structure including the lower-layer silicon oxide film 8 and the upper-layer silicon oxide film 9 which differ from each other in the film property.

Figure 2B:
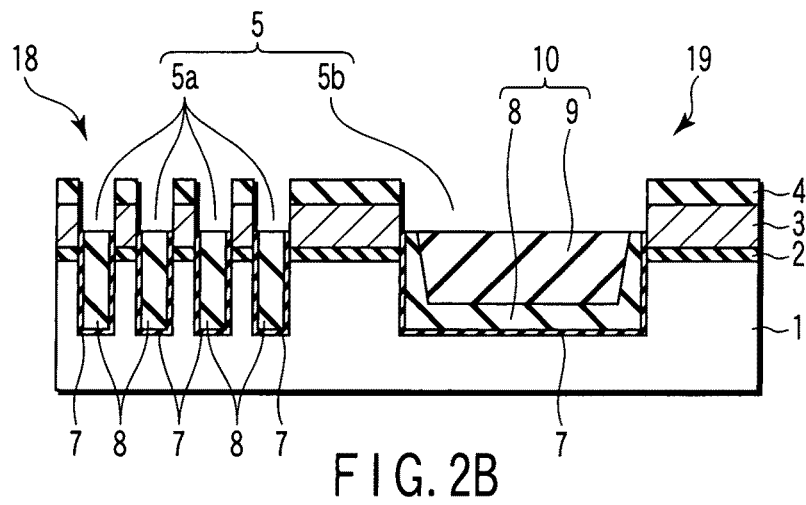

As shown in FIG. 2B, using the SiN film 4 as a mask, the liner film 7 and the lower-layer silicon oxide film 8 which are buried in each first recess 5a are retreated to a height at the intermediate portion in a film thickness direction of the polysilicon film 3 by etch back. Similarly, using the SiN film 4 as a mask, the liner film 7, lower-layer silicon oxide film 8, and upper-layer silicon oxide film 9 which are buried in the second recess 5b are retreated to the height at the intermediate portion in the film thickness direction of the polysilicon film 3 by the etch back. Then, the process of burying the first and second recesses 5a and 5b according to the embodiment is ended.

Each first recess 5a closely filled with the liner film 7 and the lower-layer silicon oxide film 8 is formed in the forming region 18 of the memory cell unit 17 to constitute the shallow isolation trench having the STI (Shallow Trench Isolation) structure. On the other hand, the second recess 5b, closely filled with the liner film 7 and the buried stacked dielectric film 10 including the lower-layer silicon oxide film 8 and the upper-layer silicon oxide film 9, is formed in the peripheral circuit forming region 19 (not shown) adjacent to the memory cell forming region 18, and the second recess 5b constitutes the trench for isolating the peripheral circuit from the memory cell unit 17 and the isolation trench in the peripheral circuit forming region 19.

Figure 2C:
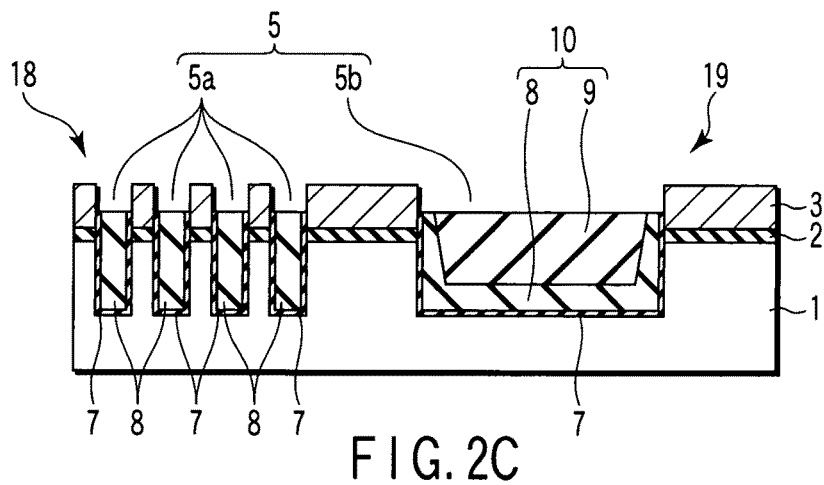

As shown in FIG. 2C, the SiN film 4 is dissolved and removed from the surface (upper surface) of the polysilicon film 3 by usual etching. This enables the surface of the polysilicon film 3 to be exposed.

Figure 3A:
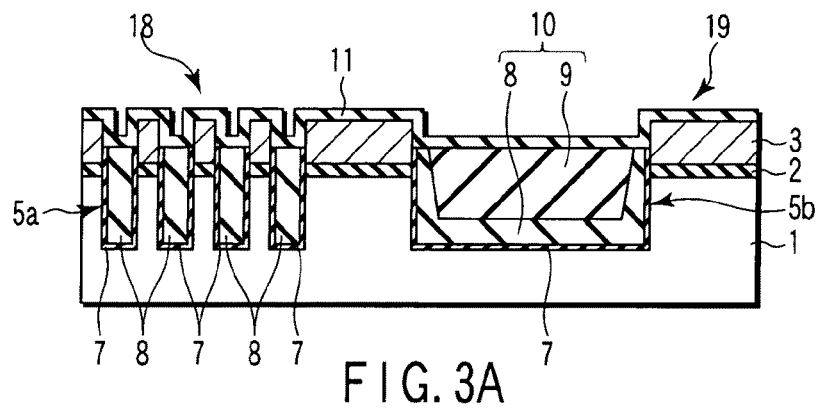
FIGS. 3A, 3B and 3C are process sectional views showing a manufacturing method for a semiconductor device of the embodiment.

As shown in FIG. 3A, an inter-poly-dielectric (IPD) 11 which constitutes an inter-electrode dielectric film is provided by the CVD method while the surfaces of the polysilicon film 3 whose surface is exposed, etch-back liner film 7, lower-layer silicon oxide film 8, and upper-layer silicon oxide film 9 are covered with the inter-poly-dielectric (IPD) 11.

Figure 3B:
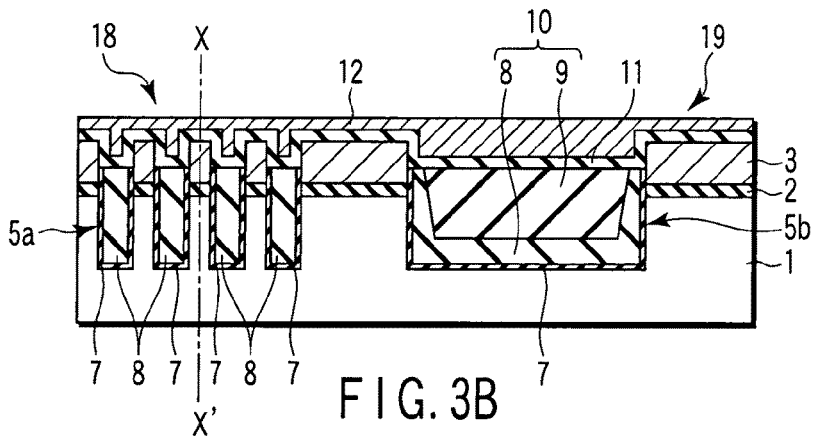

As shown in FIG. 3B, a polysilicon film 12 which constitutes a control gate electrode is provided by the CVD method while the surface of the inter-poly-dielectric 11 is covered therewith. Then, the polysilicon film 3, 12 and the inter-poly-dielectric (IPD) 11 are processed into a predetermined shape. Thus, the control gate electrode 12 functions as a so-called word line.

Figure 3C:
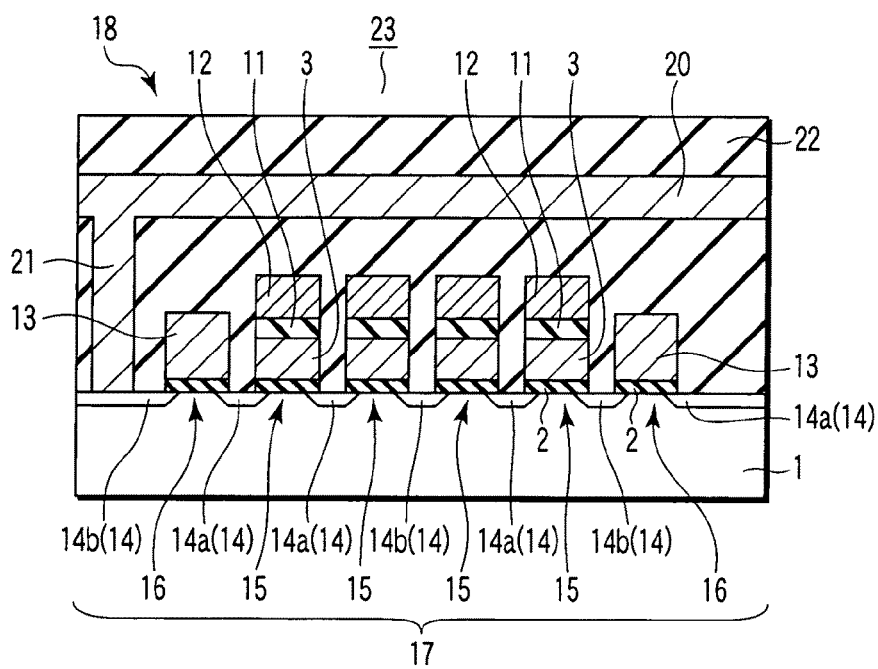

As shown in FIG. 3C, selection gate electrodes 13 are provided at plural points on the surface of the semiconductor substrate 1 along with the floating gate electrodes 3 and the control gate electrodes 12. As with the floating gate electrode 3 and the control gate electrode 12, the selection gate electrode 13 is obtained by forming the selection gate electrode 13 in a predetermined shape after the polysilicon film is provided on the tunnel oxide film (tunnel gate dielectric film) 2.

Then, impurity diffusion regions 14 which constitute source regions 14a or drain regions 14b are formed at plural points in the superficial portion of the semiconductor substrate 1. Using the tunnel oxide film 2, floating gate electrode 3, inter-poly-dielectric 11, control gate electrode 12 and selection gate electrode 13 as masks, the impurity diffusion region 14 is formed by implanting a predetermined conductivity type ion (impurity) into the superficial portion of the semiconductor substrate 1 by an ion implantation method.

As shown in FIG. 3C, plural storage transistors 15 are formed in the superficial portion of the semiconductor substrate 1 through the above processes. The storage transistor 15 includes the tunnel oxide film 2, the floating gate electrode 3, the inter-poly-dielectric 11, the control gate electrode 12, and the source region 14a and drain region 14b. At the same time, plural selection transistors 16 are formed in the superficial portion of the semiconductor substrate 1. The selection transistor 16 includes the tunnel oxide film 2, the selection gate electrode 13, and the source region 14a and drain region 14b. The storage transistor 15 and the selection transistor 16 constitute the memory cell unit 17. FIG. 3C is a sectional view taken along a broken line X-X' of FIG. 3B.

As shown in FIG. 3C, although not shown wholly, various lines including a so-called bit line 20 are provided above the control gate electrode 12. The bit line 20 is formed to be extended along a direction orthogonal to a direction (longitudinal direction) in which the control gate electrode 12 constituting the word line is extended. Through not shown, various plugs including a contact plug 21 for electrically connecting the bit line 20 and the source region 14a or drain region 14b are provided on the semiconductor substrate 1.

Actually the floating gate electrodes 3, the control gate electrodes 12, the selection gate electrodes 13, the bit lines 20, and the contact plugs 21 are provided in any one of plural interlayer dielectric films which are provided on the semiconductor substrate 1 while stacked in the plural layers. However, in order to facilitate visualization, the plural interlayer dielectric films which are provided on the semiconductor substrate 1 while stacked in the plural layers are collectively shown as a single-layer interlayer dielectric film 22 in FIG. 3C. Similarly, usually barrier metal films are provided while surfaces of the bit line 20 and the contact plugs 21 are covered therewith. In FIG. 3C, the barrier metal film is omitted in order to facilitate visualization.

Then, although the detailed description with illustration is omitted, through predetermined processes such as a bonding process and a packaging process, a rewritable flash memory (nonvolatile memory) 23 is obtained as a storage type semiconductor device including the memory cell unit 17 having a desired NAND structure shown in FIGS. 3B and 3C. As shown in FIGS. 3B and 3C, the shallow isolation trench (STI) 5a having the aspect ratio of at least 3 is closely filled with the liner film 7 and the single-layer silicon oxide film 8 formed by the condensation CVD method, and the plural shallow isolation trenches 5a are formed at narrow pitches in the memory cell forming region 18. The wider trench 5b having the aspect ratio lower than 3 is formed in the peripheral circuit forming region 19 adjacent to the memory cell forming region 18 while closely filled with the liner film 7 and the buried stacked dielectric film 10 having the two-layer structure including the single-layer silicon oxide film 8 formed by the condensation CVD method and the silicon oxide film 9. The silicon oxide film 9 is formed by the high-density plasma CVD method so as to be denser and thicker compared with the silicon oxide film 8. In addition, a floating gate type EEPROM (Electrically Erasable Programmable Read Only Memory) 23 is obtained. In the EEPROM 23, the plural storage transistors 15 are formed in the superficial portion of the semiconductor substrate 1 while electrically separated from one another by the shallow isolation trenches 5a.

FIGS. 1A to 1C, FIGS. 2A to 2C, and FIGS. 3A and 3B are sectional views along the direction (longitudinal direction) in which the word line (control gate electrode) 12 included in the EEPROM 23 is extended. That is, FIGS. 1A to 1C, FIGS. 2A to 2C, and FIGS. 3A and 3B are sectional views along the direction orthogonal to the direction in which the bit line 20 included in the EEPROM 23 is extended. On the other hand, FIG. 3C is a sectional view along the direction (longitudinal direction) in which the bit line 18 included in the EEPROM 23 is extended. That is, FIG. 3C is a sectional view along the direction orthogonal to the direction in which the word line 11 included in the EEPROM 23 is extended.

Then, first to third experiments of the film forming process according to the embodiment will be described with reference to FIGS. 7A and 7B, FIGS. 8A to 8E and FIGS. 9A to 9D.

The first film forming experiment of the embodiment will be described with reference to FIGS. 7A and 7B.

Figure 7A:
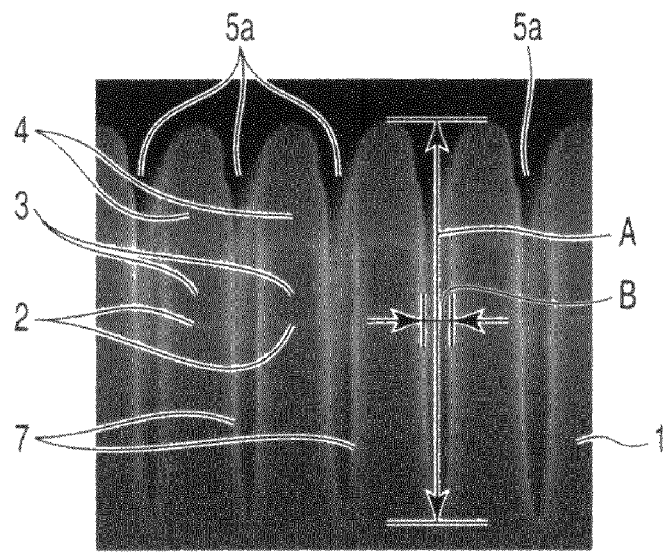
FIGS. 7A and 7B are photographs showing a first experiment of the film forming process of the embodiment.

As shown in FIG. 7A, as with the above process, the plural shallow isolation trenches (STI) 5a are formed by digging down the semiconductor substrate 1, the tunnel oxide film 2, the polysilicon film 3, and the stopper film 4. Then, the surfaces of the semiconductor substrate 1, tunnel oxide film 2, polysilicon film 3, and stopper film 4 are covered with the liner film 7. At this time, the semiconductor substrate 1, the tunnel oxide film 2, the polysilicon film 3, and the stopper film 4 are dug down such that the aspect ratio is greater than 10. The aspect ratio is obtained by dividing the depth of the shallow isolation trench 5a by the width thereof. Specifically, the stopper film 4, the polysilicon film 3, the tunnel oxide film 2, and the semiconductor substrate 1 has been dug down such that the depth of each shallow isolation trench 5a shown by a solid-line arrow A in FIG. 7A becomes about 300 nm or more after the liner film 7 is formed. At the same time, the semiconductor substrate 1, the tunnel oxide film 2, the polysilicon film 3, and the stopper film 4 has been dug down such that the width of each shallow isolation trench 5a shown by a solid-line arrow B in FIG. 7A becomes about 30 nm or less after the liner film 7 is formed.

Figure 7B:
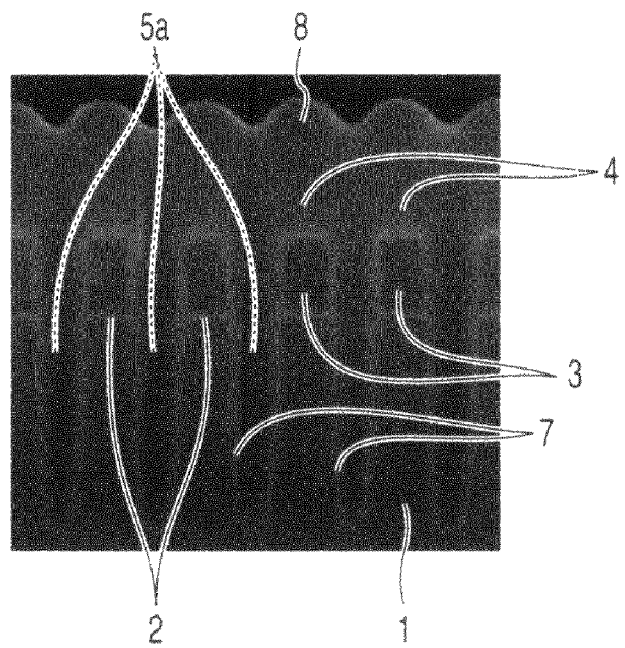

As shown in FIG. 7B, the silicon oxide film 8 is formed such that each shallow isolation trench 5a is filled therewith by the condensation CVD method. As is clear from a photograph of FIG. 7B, it is confirmed that each shallow isolation trench 5a is filled with the silicon oxide film 8 in a seamless manner without forming the void (cavity) in the shallow isolation trench 5a. That is, according to the first film forming experiment of the embodiment, the long shallow isolation trench 5a having the aspect ratio of A/B>10 (much greater than 3) is closely filled with the silicon oxide film 8 which is the condensation CVD film. In FIG. 7B, it is difficult to confirm the boundary (interface) between the stopper film 4 and the silicon oxide film 8.

The second film forming experiment of the embodiment will be described with reference to FIGS. 8A to 8E. In the second film forming experiment, a growth procedure of the silicon oxide film 8 formed by the condensation CVD method is observed as time advances. The configuration of the shallow isolation trench 5a is similar to that of the first film forming experiment. However, in the second film forming experiment, the shallow isolation trench 5a differs from that of the first film forming experiment in that the aspect ratio ranges from 3 to 10.

Figure 8A:
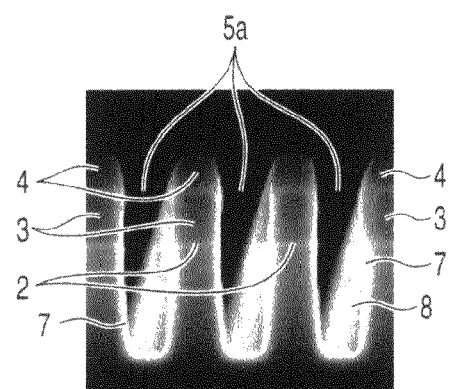
FIGS. 8A, 8B, 8C, 8D, and 8E are photographs showing a second experiment of the film forming process of the embodiment.

As shown in FIG. 8A, the film forming process of the silicon oxide film 8 is started by the condensation CVD method. Then, the extremely thin silicon oxide film 8 begins to be formed such that the surface of the shallow isolation trench 5a (liner film 7) is covered therewith.

Figure 8B:
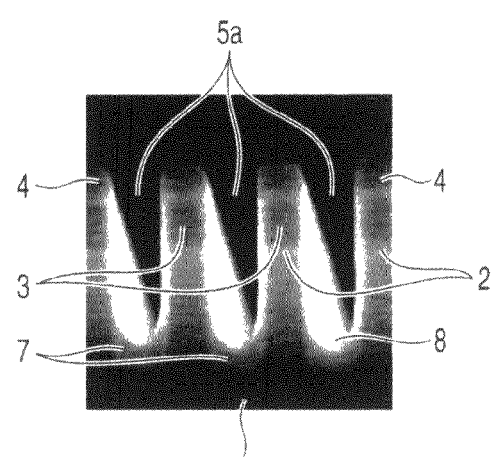

After a brief interval, as shown in FIG. 8B, the silicon oxide film 8 begins to be grown at the bottom rather than the side-face portion of the shallow isolation trench 5a.

Figure 8C:
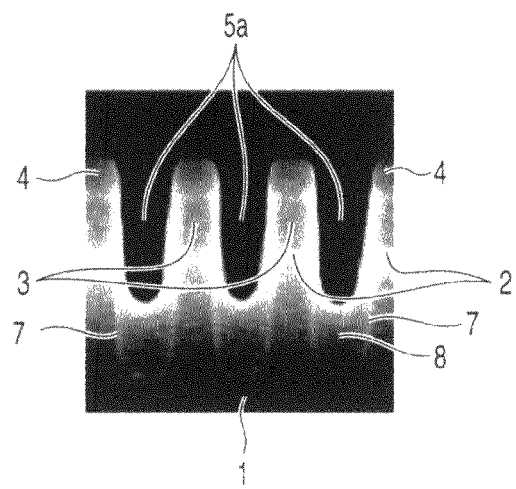

Then, as shown in FIG. 8C, the silicon oxide film 8 is grown from the bottom of the shallow isolation trench 5a until the silicon oxide film 8 reaches the intermediate portion.

Figure 8D:
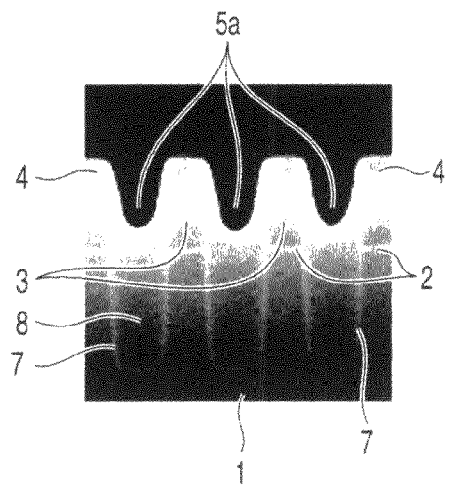

Then, as shown in FIG. 8D, the silicon oxide film 8 is grown from the intermediate portion until the silicon oxide film 8 reaches the upper portion.

Figure 8E:
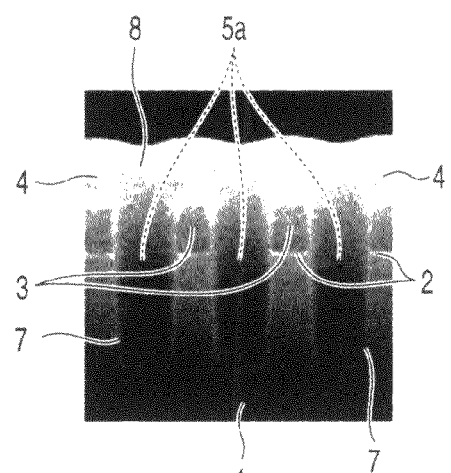

Finally, as shown in FIG. 8E, the whole of the shallow isolation trench 5a is filled with the silicon oxide film 8, and the silicon oxide film 8 reaches the opening portion of the shallow isolation trench 5a and the upper portion thereof.

Thus, according to the second film forming experiment of the embodiment, as is clear from the photographs of FIGS. 8A to 8E, the long shallow isolation trench 5a having the aspect ratio of at least 3 is seamlessly filled with the silicon oxide film 8 having the substantially homogeneous film quality by the condensation CVD method. In FIGS. 8A to 8E, it is difficult to confirm the boundary (interface) between the liner film 7 and the silicon oxide film 8. Similarly, in FIGS. 8D and 8E, it is difficult to confirm the boundary (interface) between the stopper film 4 and the silicon oxide film 8.

Then, the third film forming experiment of the embodiment will be described with reference to FIGS. 9A to 9D. In the third film forming experiment, the thickness of the silicon oxide film 8 is observed in each region in the case where the silicon oxide film 8 is formed by the condensation CVD method in various regions where the trenches differ from one another in the aspect ratio, the width, and the shape.

Figure 9A:
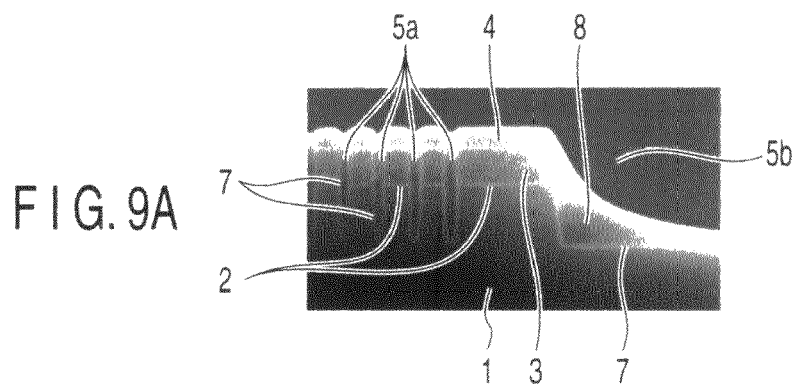
FIGS. 9A, 9B, 9C, and 9D are photographs showing a third experiment of the film forming process of the embodiment.

FIG. 9A shows a photograph in the case where the silicon oxide film 8 is formed by the condensation CVD method in the region having the structure similar to that of FIG. 1B. In the region of FIG. 9A, the first and second recesses 5a and 5b are formed by digging down the stopper film 4, the polysilicon film 3, the tunnel oxide film 2, and the semiconductor substrate 1. The surfaces of the semiconductor substrate 1, tunnel oxide film 2, polysilicon film 3, and stopper film 4 are covered with the liner film 7.

As is clear from a photograph of FIG. 9A, the first recess 5a having the large aspect ratio is closely filled with the silicon oxide film 8. On the other hand, in the second recess 5b having the small aspect ratio, only the space from the bottom to the intermediate portion is covered with the silicon oxide film 8 even in the stage at which the silicon oxide film 8 reaches the opening portion of the first recess 5a and is thickly deposited on the upper surfaces of the stopper film 4 and the liner film 7. That is, according to the photograph of FIG. 9A, it is found that the process of burying the first and second recesses 5a and 5b by the condensation CVD method of the embodiment described with reference to FIG. 1B is realized.

Figure 9B:
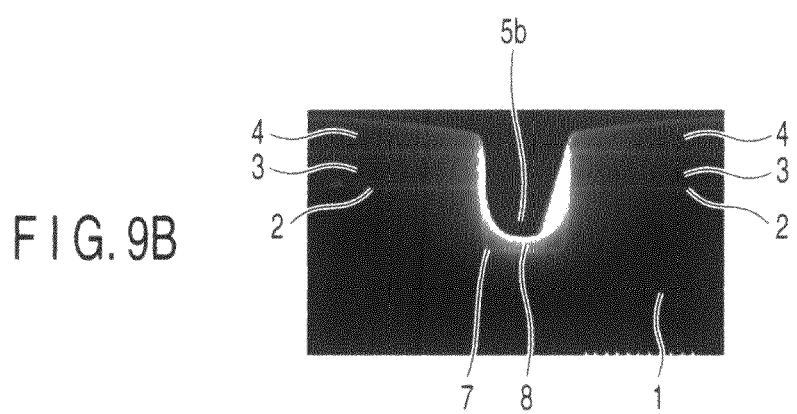

FIG. 9B shows a photograph in the case where the silicon oxide film 8 is formed by the condensation CVD method in the second recess 5b which has the aspect ratio smaller than that of the first recess 5a of FIG. 9A while having the aspect ratio greater than that of the second recess 5b of FIG. 9A. In the second recess 5b of FIG. 9B, the surfaces of the semiconductor substrate 1, tunnel oxide film 2, polysilicon film 3, and stopper film 4 are covered with the liner film 7.

As is clear from the photograph of FIG. 9B, in the second recess 5b, only the inner side-face portion and the bottom are covered with the silicon oxide film 8. That is, according to the photograph of FIG. 9B, as with the second recess 5b of FIG. 9A, only the thin silicon oxide film 8 is formed and most of the cavity of the second recess 5b is not filled with the silicon oxide film 8 in the second recess 5b having the aspect ratio lower than 3.

Figure 9C:
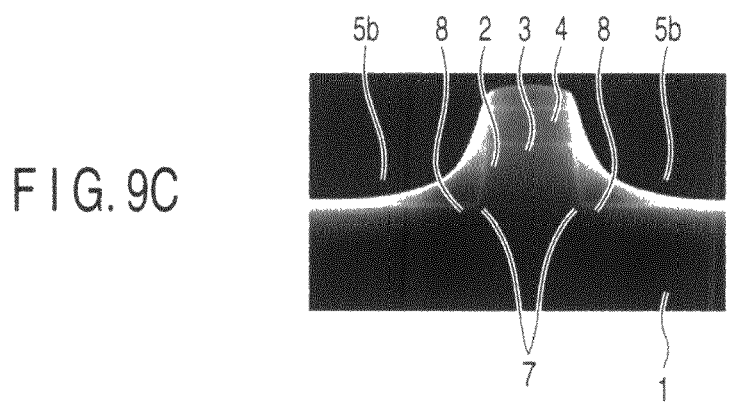

FIG. 9C shows a photograph in the case where the silicon oxide film 8 is formed by the condensation CVD method in the two second recesses 5b formed close to each other. In the two second recesses 5b of FIG. 9C, the surfaces of the semiconductor substrate 1, tunnel oxide film 2, polysilicon film 3, and stopper film 4 are covered with the liner film 7.

As is clear from the photograph of FIG. 9C, in the second recess 5b, only the inner side-face portion and the bottom are covered with the silicon oxide film 8. That is, according to the photograph of FIG. 9C, as with the second recesses 5b of FIGS. 9A and 9B, even if the two second recesses 5b are formed close to each other, only the thin silicon oxide film 8 is formed and most of the cavity of the second recess 5b is not filled with the silicon oxide film 8 in the second recess 5b having the aspect ratio lower than 3.

Figure 9D:
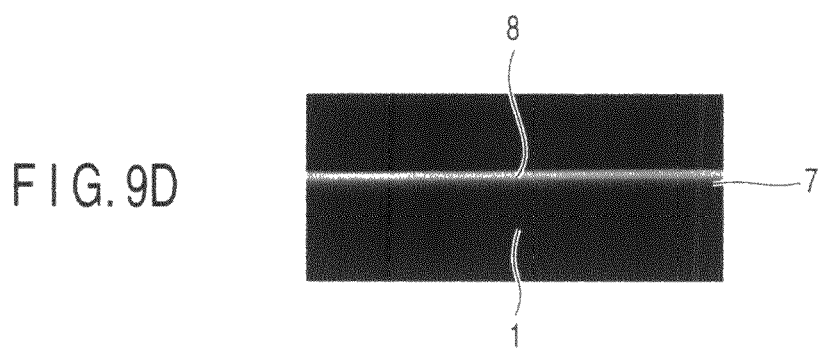

FIG. 9D shows a photograph in the case where the silicon oxide film 8 is simply formed by the condensation CVD method on the region (field portion) where the flat surface is spread in the semiconductor substrate 1. The field portion is also covered with the liner film 7. As is clear from the photograph of FIG. 9D, the silicon oxide film 8 is formed on the surface of the semiconductor substrate 1 while having the extremely thin thickness compared with those of the silicon oxide films 8 shown in FIGS. 9A to 9C. That is, according to the photograph of FIG. 9D, in the region where the flat surface is spread, the silicon oxide film 8 is hardly formed by the condensation CVD method. In FIGS. 9A to 9C, it is difficult to confirm the boundary (interface) between the stopper film 4 and the silicon oxide film 8. Similarly, in FIGS. 9B and 9D, it is difficult to confirm the boundary (interface) between the liner film 7 and the silicon oxide film 8.

Thus, according to the third film forming experiment of the embodiment, the burying speed of the condensation CVD method is increased in the narrow space such as the first recess 5a whose aspect ratio is 3 or more when compared with the wide space (pattern and field portion) such as the second recess 5b whose aspect ratio is lower than 3 and the flat surface of the semiconductor substrate 1. That is, according to the condensation CVD method, in the mixed-case of the narrow space such as the first recess 5a whose aspect ratio is 3 or more and the wide space such as the second recess 5b whose aspect ratio is lower than 3 and the flat surface of the semiconductor substrate 1, it is found that the narrow space can preferentially be buried in a self-aligned manner. In the wide space, it is also found that the thickness of the silicon oxide film 8 formed by the condensation CVD method is thinned compared with that in the narrow space.

Unlike the first recess 5a of the embodiment, generally it is extremely difficult that the recess (trench) made based on the design rule of 100 nm or less is closely filled in the seamless manner by the HDP-CVD method. Unlike the first recess 5a of the embodiment, generally it is also impossible that the recess (trench) whose aspect ratio is not lower than 3 is closely filled in the seamless manner by the HDP-CVD method. However, as is clear from the first to third film forming experiments, according to the embodiment in which the condensation CVD method is used, the first recess 5a having the width of 100 nm or less and the aspect ratio of 3 or more can be filled in the seamless manner without forming a void.

Generally, in the film formed in the wide pattern such as the second recess 5b and the surface of the semiconductor substrate 1, large force is easily generated in the film due to volume shrinkage caused by dehydrating condensation during the heating, and an external force (load) is easily applied to the film during the CMP process. Therefore, in the film formed in the wide pattern, serious problems such as cracking and peeling off easily occur due to the force caused by film stress or the external force. However, as is clear from the third film forming experiment, according to the embodiment in which the condensation CVD method is used, the film 8 formed in the wide pattern such as the second recess 5b and the surface of the semiconductor substrate 1 is formed in the thin shape while having the small volume. Therefore, in the embodiment, the force caused by film stress and the external force are small applied to the film 8 formed in the wide pattern. Therefore, in the embodiment, serious problems such as cracking and peeling off caused by the force caused by film stress or the external force hardly occur in the film 8 formed in the wide pattern.

As described above, according to the embodiment, in the first and second recesses 5a and 5b which are made in the superficial portion of the semiconductor substrate 1 while having the different aspect ratios, the first recesses 5a which are formed at narrow pitches while having the higher aspect ratio of at least 3 can closely be filled only with the silicon oxide film 8 formed substantially by the condensation CVD method. At the same time, the wide second recess 5b having the aspect ratio lower than 3 can closely be filled with the buried stacked dielectric film 10 having the two-layer structure including the lower-layer silicon oxide film 8 formed substantially by the condensation CVD method and the upper-layer silicon oxide film 9 formed by the high-density plasma CVD method.

The force caused by film stress or the external force is small applied to the silicon oxide film 8 buried in the first recess 5a because the first recesses 5a are formed at narrow pitches. The force caused by film stress or the external force is also small applied to the lower-layer silicon oxide film 8 provided in the lower-layer portion of the second recess 5b because the lower-layer silicon oxide film 8 is formed in the thin shape while having the small volume. Accordingly, serious problems such as cracking and peeling off caused by the force caused by film stress or the external force hardly occur in the silicon oxide film 8 of the first recess 5a and the lower-layer silicon oxide film 8 of the second recess 5b. Because the upper-layer silicon oxide film 9 provided in the upper-layer of the second recess 5b is densely formed with the film density higher than that of the lower-layer silicon oxide film 8, the upper-layer silicon oxide film 9 has the film strength and resistance against the force caused by film stress and the external force higher than those of the lower-layer silicon oxide film 8. Accordingly, serious problems such as cracking and peeling off caused by the force caused by film stress or the external force also hardly occur in the upper-layer silicon oxide film 9 of the second recess 5b.

Thus, according to the embodiment, the dielectric films 8 and 9 having excellent trench filling and crack-resistant properties can easily be formed in both the fine shallow isolation trench (STI) 5a having the high aspect ratio (trench depth/width) and the wide trench 5b having the aspect ratio lower than that of STI 5a. Therefore, serious problems such as cracking and peeling off can be suppressed in the flash memory (EEPROM) 23 of the embodiment. According to the manufacturing method for a semiconductor device of the embodiment, reliability and performance of the flash memory 23 can be enhanced while the finer-line process and the higher-level of integration are advanced.

According to the burying method of the embodiment, the lower-layer silicon oxide film 8 provided in the lower-layer portion of the second recess 5b is concurrently formed in filling the first recess 5a with the silicon oxide film 8. At the same time, when the two kinds of silicon oxide films 8 and 9 having different materials and film forming methods are provided in the second recess 5b, it is not necessary that the etching or CMP be individually performed in each time each of the silicon oxide films 8 and 9 is provided. Accordingly, the second recess 5b can efficiently and easily be filled with the silicon oxide film 8 and 9. That is, the structure shown in FIG. 3B can be manufactured with the simple process. According to the manufacturing method for a semiconductor device of the embodiment, the fine flash memory (semiconductor device) 23 having the higher-level of integration can efficiently and easily be manufactured. Because production cost is reduced in the semiconductor device such as the fine flash memory 23 having the higher-level of integration, the flash memory 23 can be manufactured at low cost.

The silicon oxide film 8 formed by the condensation CVD method hardly contains carbon because the silicon oxide film 8 is formed by the film forming material which mainly contains the silane ($SiH_4$) 36 and hydrogen peroxide ($H_2O_2$) 37. According to the investigation of the inventors, a carbon concentration is not more than 1E19 atm/cc in the silicon oxide film 8. Therefore, the fixed charge which causes the degradation of the device characteristics is hardly generated in the silicon oxide film 8. Because the silicon oxide film 8 formed by the condensation CVD method has the fixed charge-free property, not only does the silicon oxide film 8 have the excellent trench filling property, but also the device characteristics is hardly degraded in the obtained semiconductor device. Because of the fixed charge-free property, the attention is now drawn to the silicon oxide film 8 formed by the condensation CVD method as the film instead of a polysilazane-based coating film.

According to the embodiment, the plural recesses 5a and 5b having the different aspect ratios can efficiently and easily be filled with the films 8 and 9, and the improvement of the trench filling property and the suppression of cracking and peeling off can be achieved in the films 8 and 9 buried in the recesses 5a and 5b. Therefore, the semiconductor device 23 in which the finer-line process, the higher-level of integration, the reliability, and the performance are improved can efficiently and easily be manufactured.

The manufacturing method for a semiconductor device of the invention is not limited to the embodiment. Various changes and modifications of a part or the whole of the configuration and manufacturing process can appropriately be made, without departing from the scope of the invention, through the appropriate combination of various settings.

For example, in the second recess 5b, the method for forming the upper-layer buried dielectric film 9 which is provided on the silicon oxide film 8 as the lower-layer buried dielectric film formed by the condensation CVD method is not limited to the above-described high-density plasma CVD method. Any method other than the high-density plasma CVD method may be used as the method for forming the upper-layer buried dielectric film 9 as long as the upper-layer buried dielectric film 9 can be formed with the film density higher than that of the lower-layer buried dielectric film 8. For example, the upper-layer buried dielectric film 9 may be formed by the ordinary plasma enhanced CVD (PE-CVD) method or the coating method, and so on.

Additional advantages and modifications will readily occur to those skilled in the art. Therefore, the invention in its broader aspects is not limited to the specific details and representative embodiments shown and described herein. Accordingly, various modifications may be made without departing from the spirit or scope of the general inventive concept as defined by the appended claims and their equivalents.

What is claimed is:

1. A manufacturing method for a semiconductor device comprising:

generating on a substrate liquid-phase silanol having fluidity by causing a source gas made of a material containing silicon to react with a source gas made of a material containing oxygen, introducing the silanol into a first recess until the first recess is filled with the silanol, the first recess having an aspect ratio of a predetermined value or more in a plurality of recesses provided in the substrate and having different aspect ratios, and introducing the silanol into a space from a bottom to an intermediate portion in a second recess while an inner side-face portion is covered with the silanol, the second recess having an aspect ratio lower than the predetermined value in the recesses;

burying a silicon oxide film in the whole of the first recess and providing the silicon oxide film from the bottom to the intermediate portion in the second recess while the inner side-face portion thereof is covered with the silicon oxide film, by converting the silanol introduced into the first and second recesses into the silicon oxide film by dehydrating condensation;

providing a dielectric film on the silicon oxide film until the dielectric film is buried from the intermediate portion to an upper portion in the second recess in which the silicon oxide film is provided, the dielectric film having film density higher than that of the silicon oxide film;

wherein the first recess is formed by digging down a memory cell forming region at least from a floating gate electrode film to a superficial portion of a semiconductor substrate while forming the second recess in a region except for the memory cell forming region, the second recess having substantially the same depth as the first recess and a width greater than that of the first recess, the memory cell forming region including the semiconductor substrate, a tunnel dielectric film provided on the semiconductor substrate, and the floating gate electrode film provided on the tunnel dielectric film;

providing a stopper film on the floating gate electrode film, the first and second recesses being formed by digging down films from the stopper film to the superficial portion of the semiconductor substrate, and removing the silicon oxide film and the dielectric film which are provided above the stopper film after the silicon oxide film and the dielectric film are buried in the first and second recesses; and retreating the silicon oxide film in the first recess, the silicon oxide film and the dielectric film in the second recess, and the dielectric film to an intermediate portion in a thickness direction of the floating gate electrode film.

2. The method according to claim 1, wherein the source gases which form as an intermediate reaction product a material having the fluidity are used in generating the silanol, the material having the fluidity in the case where the intermediate reaction product is placed at a temperature of a boiling point or less or in the case where an equilibrium state between a liquid phase and a gas phase is achieved.

3. The method according to claim 1, wherein $SiH_4$ is used as the material containing silicon and at least $H_2O_2$ is used as the material containing oxygen.

4. The method according to claim 1, wherein the source gases are supplied toward the substrate after the substrate is set at a temperature ranging from -10 to 15° C.

5. The method according to claim 1, wherein a substantially fixed charge-free silicon oxide film, having a carbon concentration of 1E19 atm/cc or less, is formed as the silicon oxide film.

6. The method according to claim 1, wherein the dielectric film is provided by at least one of a plasma CVD method and a coating method.

7. The method according to claim 6, wherein the dielectric film is provided by a high-density plasma CVD method.

8. The method according to claim 1, wherein the first recess has a width of 100 nm or less and a depth of 300 nm or more.

9. The method according to claim 1, wherein the first recess has an aspect ratio of 3 or more.

10. The method according to claim 1, wherein the second recess has substantially the same depth as that of the first recess.

11. The method according to claim 1, wherein the second recess has a width greater than that of the first recess.

12. The method according to claim 1, wherein the second recess has a width greater than 100 nm.

13. The method according to claim 1, wherein the second recess has an aspect ratio lower than 3.

14. The method according to claim 1, wherein a plurality of the first recesses are provided at substantially constant intervals in the substrate, and at least one second recess is provided in the substrate while separated away from the closest first recess by an interval greater than the intervals between the first recesses.

15. The method according to claim 1, wherein a liner film is provided in surfaces of the first and second recesses.

16. The method according to claim 1, wherein, in the second recess, the silicon oxide film is provided at a position below the tunnel dielectric film except for the inner side-face portion, and the bottom is covered with the silicon oxide film.

17. The method according to claim 1, wherein an STI is formed by burying the silicon oxide film in the first recess.

18. The method according to claim 1, wherein the second recess is formed in a peripheral circuit forming region adjacent to the memory cell forming region.

* * * * *